United States Patent [19]

Douziech et al.

[11] Patent Number: 4,855,688

[45] Date of Patent: Aug. 8, 1989

[54] MULTIPLE REFERENCE FREQUENCY GENERATOR

[75] Inventors: Patrick Douziech; Philippe Berger, both of Villingen, France

[73] Assignee: SGS-Thomson Microelectronics S.A., France

[21] Appl. No.: 184,258

[22] Filed: Apr. 21, 1988

[30] Foreign Application Priority Data

Apr. 24, 1987 [FR] France ................... 87 05830

[51] Int. Cl.$^4$ ............................................. H03L 7/20
[52] U.S. Cl. ............................................. 331/8; 331/25
[58] Field of Search ................... 331/8, 17, 18, 20, 25, 331/34; 328/14, 15; 307/529

[56] References Cited

U.S. PATENT DOCUMENTS 3,956,961  5/1976  Peterson ...................... 331/25 X
4,105,946  8/1978  Ikeda ........................... 331/1 A

FOREIGN PATENT DOCUMENTS 0200847  11/1986  European Pat. Off. .

OTHER PUBLICATIONS

Japanese Abstracts of Japan, vol. 6, No. 155 (E-125) (1033), Aug. 17, 1982.

*Primary Examiner*—Eugene R. LaRoche
*Assistant Examiner*—Robert J. Pascal
*Attorney, Agent, or Firm*—Lowe, Price, LeBlanc, Becker & Shur

[57] ABSTRACT

In a multiple reference frequency generator, instead of using a quartz crystal for each of the accurate frequencies to be produced, a single quartz crystal is used together with a current controlled oscillator (ICO) and a phase loop comprising a phase comparator (PHC) and a control current generator (GC). The current generator provides a current varying as a function of a voltage and inversely proportional to a resistor value. In a first step, the phase loop causes the oscillator to oscillate at a frequency F0 and the resistor has a value R0. In a second phase, the loop is opened and the resistor is given a value R1 causing the oscillator to oscillate at a frequency $F1 = F0 \times R0/R1$.

3 Claims, 3 Drawing Sheets

MULTIPLE REFERENCE FREQUENCY GENERATOR

BACKGROUND OF THE INVENTION

The instant invention relates to circuits for generating accurate reference frequencies.

The invention applies in particular to the generation of reference frequencies for modulators or demodulators of frequency modulated signals.

The invention has been implemented in connection with modulation and demodulation circuits for luminance and chrominance TV signals, and, in particular, for recording these signals in a videotape recorder. For these circuits, a plurality of accurate frequencies corresponding to standard values are generated for the various existing transmission systems (PAL, SECAM, NTSC).

Those accurate frequencies are conventionally generated by means of quartz oscillators with a specific quartz crystal for each of the frequencies to be generated. However, this method is expensive, mainly because the quartz crystal is not incorporated into an integrated circuit wherein the reference frequencies are used.

Another method consists of using only one quartz and logic circuits for counting, frequency dividing, and digital-analog converting, etc, for generating a plurality of different frequencies. For example, the crystal oscillation frequency can be divided for defining a calibration time duration, large enough with respect to the crystal frequency and a voltage controlled oscillator (VCO) provides a signal having the desired frequency. The VCO provides the desired frequency, different from the quartz frequency by counting the number of oscillation periods emitted by this quartz during the calibration time duration defined by the crystal oscillator and the dividers. The period number is compared with a programmed adjustable value which defines the various desired output frequencies. The result of this comparison is used for incrementing a counter, the output of which controls a digital-analog converter. The converter drives the oscillator for adjusting the output frequency thereof at a value that is accordingly associated with the programmed adjustable value.

This type of solution uses a large area of an integrated circuit due to the large number of complex circuits to be used (counters, dividers, converters).

BRIEF DESCRIPTION OF THE INVENTION

The invention provides for a new accurate frequency generation circuit structure avoiding the above drawbacks.

The generator according to the invention, using only one reference frequency, comprises a current controlled oscillator, a phase comparator receiving (1) the reference frequency and (2) the oscillator output. A control loop connects the output of the phase comparator to a control input of the oscillator, this loop comprising a filter capacitor. The loop additionally comprises a switch for opening the loop, this switch being disposed between the output of the phase comparator and the capacitor, and a voltage-controlled current generator for generating a variable current as a function of a control voltage and inversely proportional to a resistor value. The resistor is implemented as an array of resistors and switches, with a switch control means for adjusting the effective value of the resistor to a desired value. The output current from the generator is applied to the control input of the oscillator and the voltage across the capacitor is applied to the input of the current generator.

Using bipolar integrated circuit techniques, a voltage-controlled current generator having an output current inversely proportional to a resistor is relatively easy to carry out. Additionally, using bipolar design techniques, it is well known to implement current controlled oscillators. It should be noted that a device usually called a VCO (voltage-controlled oscillator) is very often in fact an oscillator controlled not by a volage but by a current. The output frequency is proportional to the control current in the normal operating range of the oscillator.

The circuit generally operates as follows:

in a first step, the loop is closed and a first resistor value R0 is chosen for the resistor array. The loop then determines that:

the oscillator oscillates at the reference frequency F0, the capacitor is charged at a voltage value V0 such that the resulting current I0 in the resistor array corresponds with the control current necessary for obtaining an oscillation of the oscillator at the frequency F0, in a second step, the loop is opened; the capacitor continues providing the formerly set voltage F0 while another resistor value R1 is chosen for the resistor array so that a current I1 for controlling the oscillator and thereby an output frequency F1 are obtained.

If the control current of the oscillator is inversely proportional to the resistor value of the array, and proportional to the oscillation frequency, one has:

$$F1 = F0 \times (R0/R1)$$

For establishing any output frequency from the single reference frequency F0, it is sufficient to use in the resistor array a resistor value which presents the same ratio with respect to R0 as the ratio between the reference frequency and the desired output frequency.

The technology of bipolar integrated circuits is suitable for implementing resistors, the value of which is not known with a high accuracy, but the relative values of which are accurate if those resistors are carried out on a same circuit chip.

Therefore, according to the invention, a resistance ratio, known with accuracy, is converted into a frequency ratio. A single reference frequency is necessary and as many output frequencies as desired can be obtained. Those frequencies do not appear simultaneously but sequentially at the output of the generator according to the invention during the second above mentioned step.

To simultaneously obtain a plurality of frequencies, a plurality of generators according to the invention must be used, although all of those generators can use the same reference frequency and, therefore, a single quartz crystal.

BRIEF DESCRIPTION OF THE DRAWINGS

These features and advantages of the invention and others will be explained in more detail in the following description in connection with the attached drawings wherein.

DETAILED DESCRIPTION OF PREFERRED EMBODIMENTS

Figure 1:
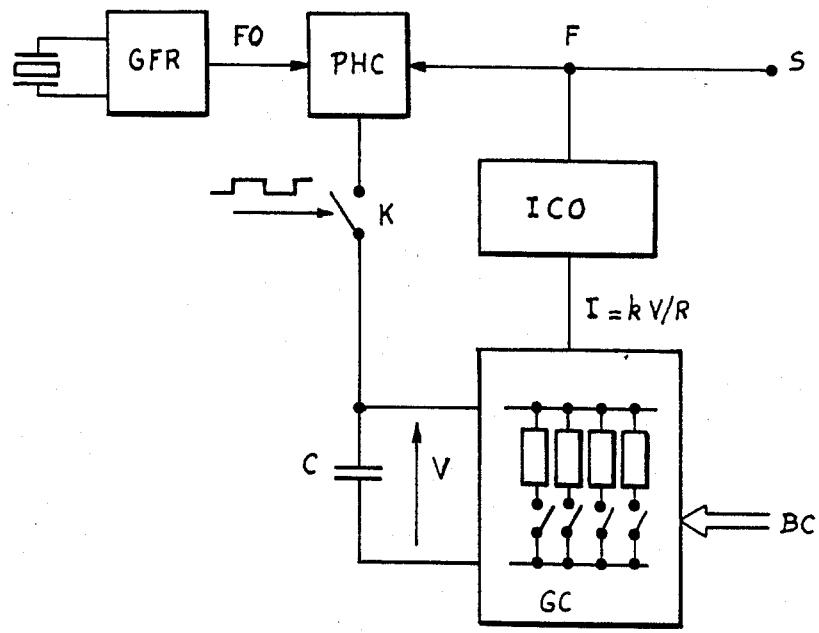
FIG. 1 is a block diagram of a frequency generator according to the invention.

The block diagram of FIG. 1 shows the main components of the frequency generator according to the invention.

Those components are as follows:

a phase comparator PHC, a current controlled oscillator ICO, a current generator GC controlled by a voltage and the output current of which is proportional to a resistor value;

a capacitor C, a switch K.

The oscillator ICO, the phase comparator PHC, the current generator GC and the capacitor C constitute a phase loop through which the output frequency F of the generator is adjusted on a reference frequency F0 provided to the phase comparator PHC.

The reference frequency is obtained either externally from the integrated circuit implementing the invention, or within the same integrated circuit. In the example, the reference frequency F0 is provided by an oscillator GFR inside the integrated circuit, associated with an external quartz crystal.

The phase comparator receives the reference frequency signal F0 and the output signal from the oscillator ICO and provides an output current representing the phase shift between the frequencies of the signals. The current is applied through switch K to the capacitor C used for smoothing the current variations and used in the example for storing the output voltage generated by the phase comparator when the loop is operating (switch K closed) and to hold the output voltage during a certain lapse of time even after the opening of the loop. The voltage V through the capacitor is applied as an input signal to the current generator GC, the output current of which is therefore controlled by the voltage V.

It can be assumed in the following that the output current I of the generator GC is proportional to the voltage V, but the circuit operates as well if this is not true. It is only necessary that the current varies with the voltage in a suitable direction in accordance with the action of the loop. That is, if a phase shift between the inputs of comparator PHC increases the voltage V, the current I and the frequency F generated by this current reduce the phase shift.

The output current I is applied as a control current to the oscillator ICO, the output frequency F of which is proportional to the current I. The output frequency can also be inversely proportional to the output current without changing the principle of the invention.

Current generator GC comprises a resistor having a resistance R wherein output current I is inversely proportional to the value R. The resistor is carried out by means of an array of switchable resistors which the switches controlled to vary the value R. The simplest way of carrying out this array consists in using a plurality of parallel resistors, each being serially connected with a respective switch, as shown in FIG. 1.

The switches of the resistor array are controlled by a conductor bus BC (only one conductor if there is only one switch, that is in the case where one wishes to obtain only one output frequency different from the quartz frequency.

The operation of the device is as follows:

In a preliminary step, the switch K is closed and the loop operates so that the output frequency of the oscillator ICO corresponds to the reference frequency F0 and capacitor C is charged at a potential value V. The control current of oscillator ICO (that is also the output current of generator GC) is I0. During this phase, the control bus BC provides control signals such that the resistor value of the array of generator GC is R0.

During a second step, switch K is open and control signals are applied through the bus BC control to the resistor array switches so that the resistor value is equal to R1. The voltage V across capacitor C remains constant if the input of the current generator GC presents a sufficiently high impedance. The generator GC provides then at its output a current I such as $I = I0 \times R0/R1$. The out frequency of oscillator ICO becomes $F1 = F0 \cdot R0/R1$, if the frequency is proportional to the control current. Accordingly, an output frequency F is produced which is proportional to a stable reference frequency F0 (generated by a crystal oscillator) and proportional to a resistor ratio.

To generate another frequency, the first step is repeated, again using a resistor value equal to R0, then the second step is repeated with a resistor value R2. The repetition of the first step is not strictly necessary if capacitor C has not had time to be discharged during the step of generating the first frequency.

A practical implementation of the current generator GC will now be explained.

Figure 2:
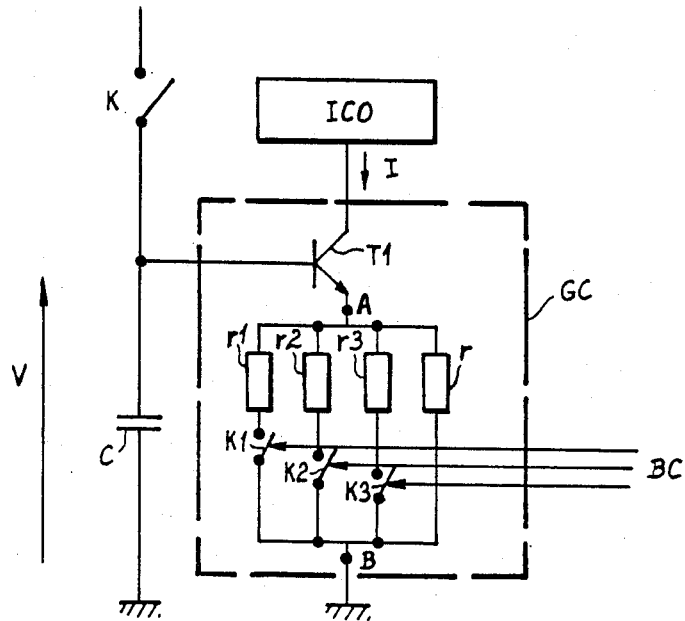
FIG. 2 shows a simplified embodiment of the current generator of FIG. 1.

FIG. 2 shows a simplified example wherein the generator only comprises:

a set of resistors R1, R2, R3, configured to be parallel connected with each other by switches in series with each resistor, an amplifying transistor T1 serially connected with the resistor set.

As an example, four resistors are shown, capable of being connected in parallel across two terminals A and B, the resistors between the terminals A and B defining the output current of the generator GC. One of the resistors, labelled r, is permanently connected across the terminals A and B; the other resistors, r1, r2, r3, have one end connected to terminal A and another end connected to a respective switch, K1, K2, K3. The switches are individually controlled by the bus BC for parallel connecting with resistor r one or a plurality of the other resistors and for accordinly modifying the net resistor value between terminals A and B.

Terminal B is connected to ground and terminal A is connected the emitter of a transistor T1, the collector of which constitutes the current output of generator GC. The base of transistor T1 is connected to one terminal of capacitor C, the other terminals of the capacitor being grounded.

Transistor T1 operates as a follower-emitter amplifier. If the transistor has sufficient gain, the output current I of generator GC is substantially equal to the current in the emitter of transistor T1 and this current is equal to $(V - Vbe)/R$, wherein R is the resistance between the terminals A and B and Vbe is the base-emitter voltage drop of transistor T1. Voltage drop Vbe is substantially independent of current I, so that an output of the current generator controlled responsive to the voltage V and inversely proportional to a resistor value. For reducing the discharge current of capacitor C, a buffer having a high input impedance can be serially connected between capacitor C and the base of transistor T1.

Figure 3:
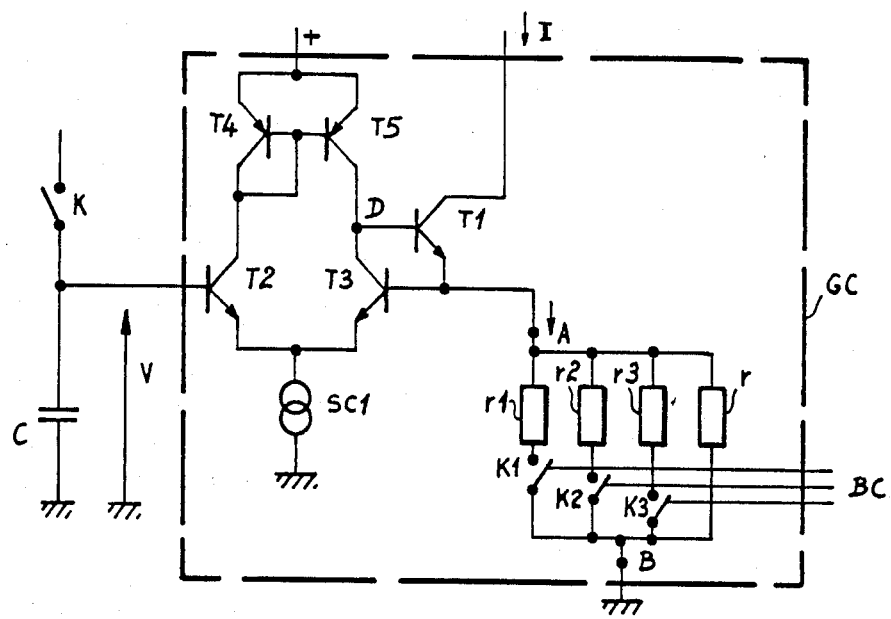
FIG. 3 shows an alternate embodiment of the current generator.

FIG. 3 shows an alternate, more sophisticated, embodiment of current generator GC, this alternate embodiment taking into account the variations of the voltage drop Vbe as a function of current I because these variations cause a proportionally mismatch between current I and the conductance between terminals A and B for a constant voltage V. In the current generator of FIG. 3, capacitor C is connected to a first input of a differential amplifier stage comprising four transistors T2, T3, T4, T5, and a current source SC1. The output D of the differential amplifier stage is connected with the base of a transistor T1 having the same function as transistor T1 of FIG. 2. Terminal A, that is the emitter transistor T1, is connected to a second input of the differential amplifier. Here, the first input corresponds to the base of transistor T2 and the second to the base of transistor T3, the output of the stage corresponding to the collector of T3.

By this control set, the voltage difference between the two inputs of the differential stage tends towards 0 (inasmuch as the gain of this stage is higher) so that the potential of terminal A tends to exactly follow the potential V applied to the first input of the stage. Even if it remains a certain difference between those potentials, this difference is small and independent of the current flowing through the transistor.

Figure 4:
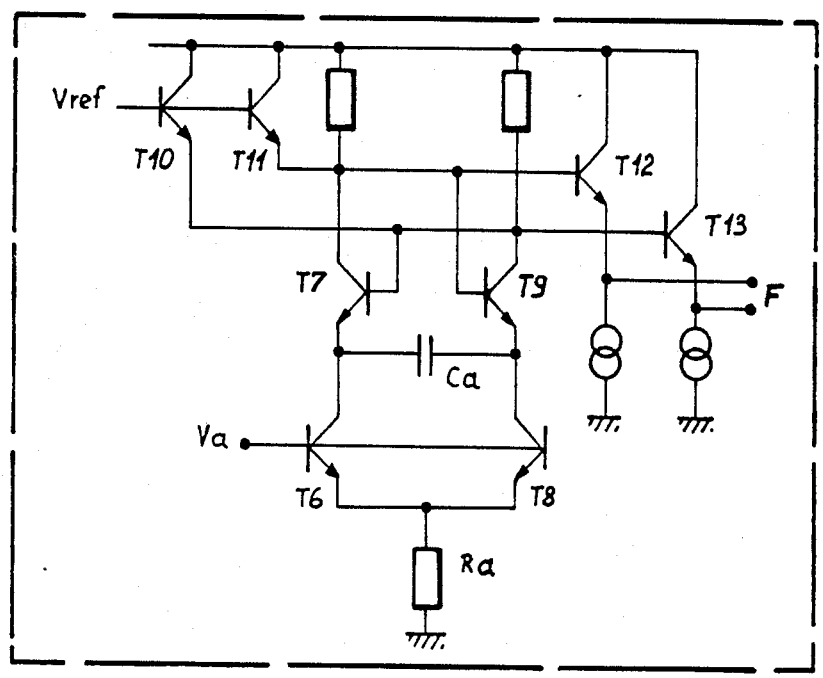
FIG. 4 is a detailed diagram of a voltage or current controlled oscillator.

The current controlled oscillator uses a conventional voltage controlled oscillator as shown in FIG. 4. It comprises two differential paths or branches, one comprising two serial transistors T6 and T7 and the other two serial transistors T8 and T9. The two branches are interconnected with a resistor Ra across which flows the sum of the currents flowing in the two branches. Capacitor Ca connects the collectors of transistors T6 and T8 and the bases of transistors T6 and T8 are connected with each other. The base of transistor T7 is connected with the collector of transistor T9 and conversely. Other transistors T10 and T11 are provided for biasing the bases and collectors of transistors T7 and T9. Finally, two transistors T12 and T13 correspond to common collector amplifiers, the bases of those transistors being connected with the collectors of transistors T7 and T9. The output of the oscillator is a differential output F on the emitters of T12 and T13.

This circuit constitutes a current or voltage controlled oscillator: the control voltage would be the potential Va on the bases of transistors T6 and T8. The control current is the current circulating in resistor Ra, that is also the current circulating and shared between transistors T6 and T8.

Therefore, advantageously, the current controlled oscillator ICO and the current generator GC are associated as follows: the transistor T6 of FIG. 4 is constituted by the transistor T1 of FIG. 3 and resistor Ra of FIG. 4 is constituted by the resistor array r, r1, r2, r3, of FIG. 3.

Figure 5:
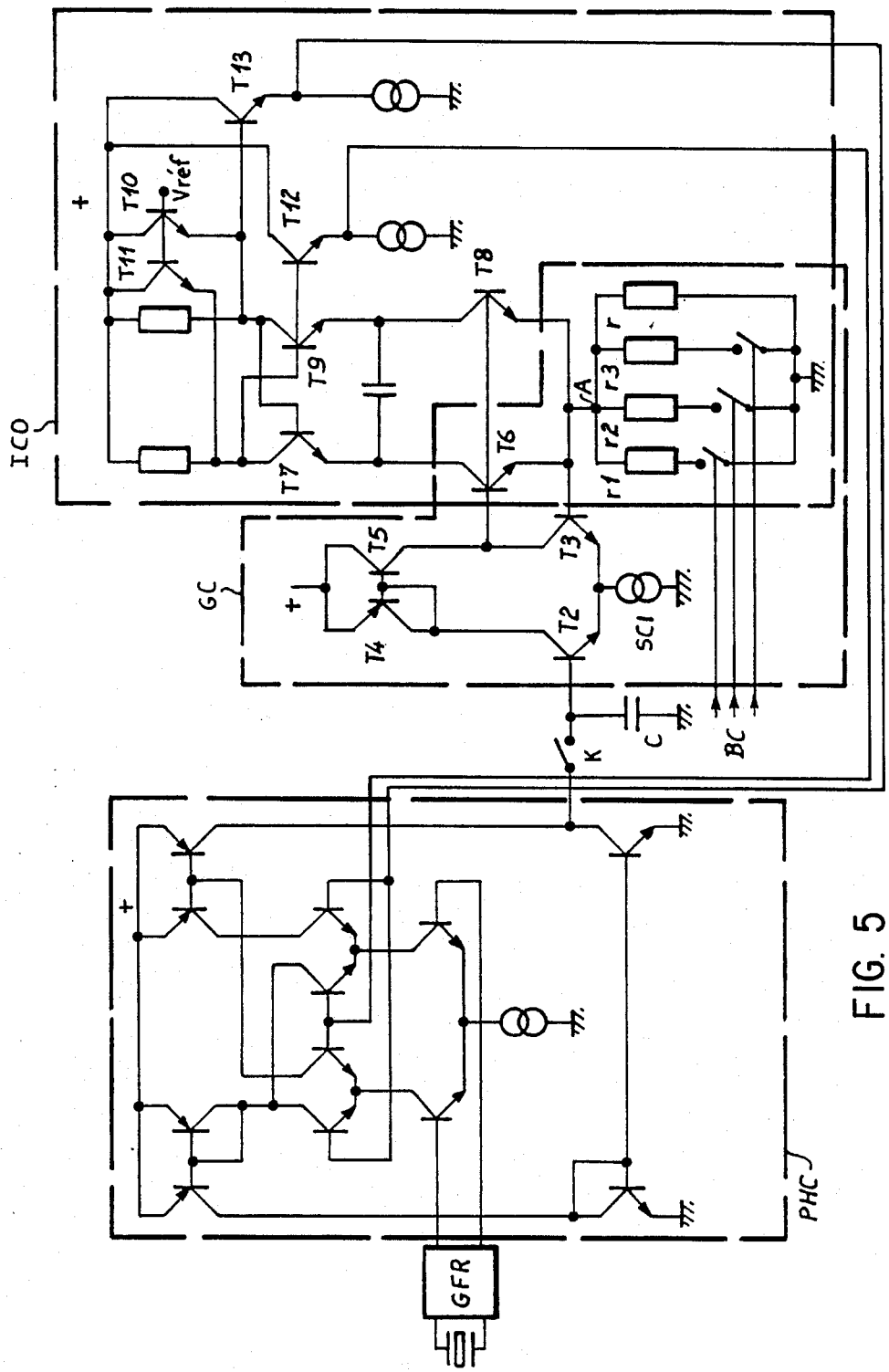
FIG. 5 shows a detailed circuit diagram of an embodiment of the frequency generator according to the invention.

FIG. 5 shows an example of a detailed implementation for the complete frequency generator circuit according to the invention. In this example, the current controlled oscillator of FIG. 4 is employed together with the control current generator of FIG. 3, associated as indicated above, and a conventional phase comparator. This combinaison will appear clearly to those skilled in the art in view of the above.

We claim:

1. An accurate frequency generator using a single reference frequency (F0) comprising a current controlled oscillator (ICO), a phase comparator (PHC) receiving on the one hand the reference frequency and on the other hand the oscillator output, and a loop connecting the phase comparator output with a control input of the oscillator, this loop comprising a filtering capacitor (C), the loop further comprising a switch (K) for opening the loop, this switch being arranged between the output of the phase comparator and the capacitor, and a voltage controlled current generator (GC), capable of generating on its output a variable current as a function of a control voltage and reversely proportional to a resistance value of a resistor, the resistor corresponding to an array of resistors (r, r1, r2, r3) and switches (K1, K2, K3) with means for controlling the switches for adjusting the net value of the resistor to a desired value, the output current of the generator being applied to the control input of the oscillator and the voltage across the capacitor being applied to the input of the current generator.

2. A frequency generator according to claim 1, wherein the voltage controlled current generator comprises a transistor (T1), the collector of which provides the variable current output, the base of which receives the control voltage, and the emitter of which is connected with the resistor array.

3. A frequency generator according to claim 2, wherein the control current generator comprises a differential amplification stage (T2, T3, T4, T5), a first input of which is connected with the capacitor, the second input of which is connected with the emitter of said transistor (T1) and the output of which is connected with the base of said transistor.

* * * * *